United States Patent
Wang et al.

(10) Patent No.: US 10,809,305 B2
(45) Date of Patent: Oct. 20, 2020

(54) SYSTEM AND METHOD FOR DETECTING AND RESPONDING TO A BATTERY OVER-DISCHARGE CONDITION WITHIN A VEHICLE

(71) Applicant: Ford Global Technologies, LLC, Dearborn, MI (US)

(72) Inventors: Xu Wang, Northville, MI (US); Xiao Guang Yang, Northville, MI (US); Zhimin Yang, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 330 days.

(21) Appl. No.: 15/903,850

(22) Filed: Feb. 23, 2018

(65) Prior Publication Data
US 2019/0265302 A1    Aug. 29, 2019

(51) Int. Cl.
| H01M 10/44 | (2006.01) |
| H01M 10/46 | (2006.01) |
| G01R 31/3842 | (2019.01) |
| G01R 31/36 | (2020.01) |
| H02J 7/00 | (2006.01) |
| H01M 10/48 | (2006.01) |
| G01R 31/389 | (2019.01) |
| G01R 31/396 | (2019.01) |

(52) U.S. Cl.
CPC ..... *G01R 31/3842* (2019.01); *G01R 31/3648* (2013.01); *G01R 31/389* (2019.01); *G01R 31/396* (2019.01); *H01M 10/486* (2013.01); *H02J 7/0047* (2013.01)

(58) Field of Classification Search
CPC .. H02J 7/0026; H02J 2007/004; H02J 7/0021; H02J 7/0091
USPC ........... 320/107, 127, 132, 135, 136, 150
See application file for complete search history.

(56) References Cited

U.S. PATENT DOCUMENTS

| 6,987,377 | B2 | 1/2006 | Sakakibara et al. |
| 8,558,712 | B2 | 10/2013 | Fechalos et al. |
| 8,583,389 | B2 | 11/2013 | Aoshima et al. |
| 2005/0068007 | A1* | 3/2005 | Prema ................ B60K 6/445 320/132 |
| 2010/0000809 | A1* | 1/2010 | Nishi ................ B60K 6/445 180/65.29 |
| 2017/0054311 | A1* | 2/2017 | Masias ............... H02J 7/0031 |
| 2017/0133729 | A1 | 5/2017 | Reitzle et al. |

* cited by examiner

*Primary Examiner* — Edward Tso
(74) *Attorney, Agent, or Firm* — David Kelley; Brooks Kushman P.C.

(57) ABSTRACT

A system includes contactors electrically connecting a traction battery and a vehicle bus when closed, and a controller configured to issue an over discharge alert and open the contactors responsive to a battery temperature rate of change, measured during battery discharge and while a battery state of charge (SOC) exceeds a first threshold, being greater than a predefined rate.

17 Claims, 3 Drawing Sheets

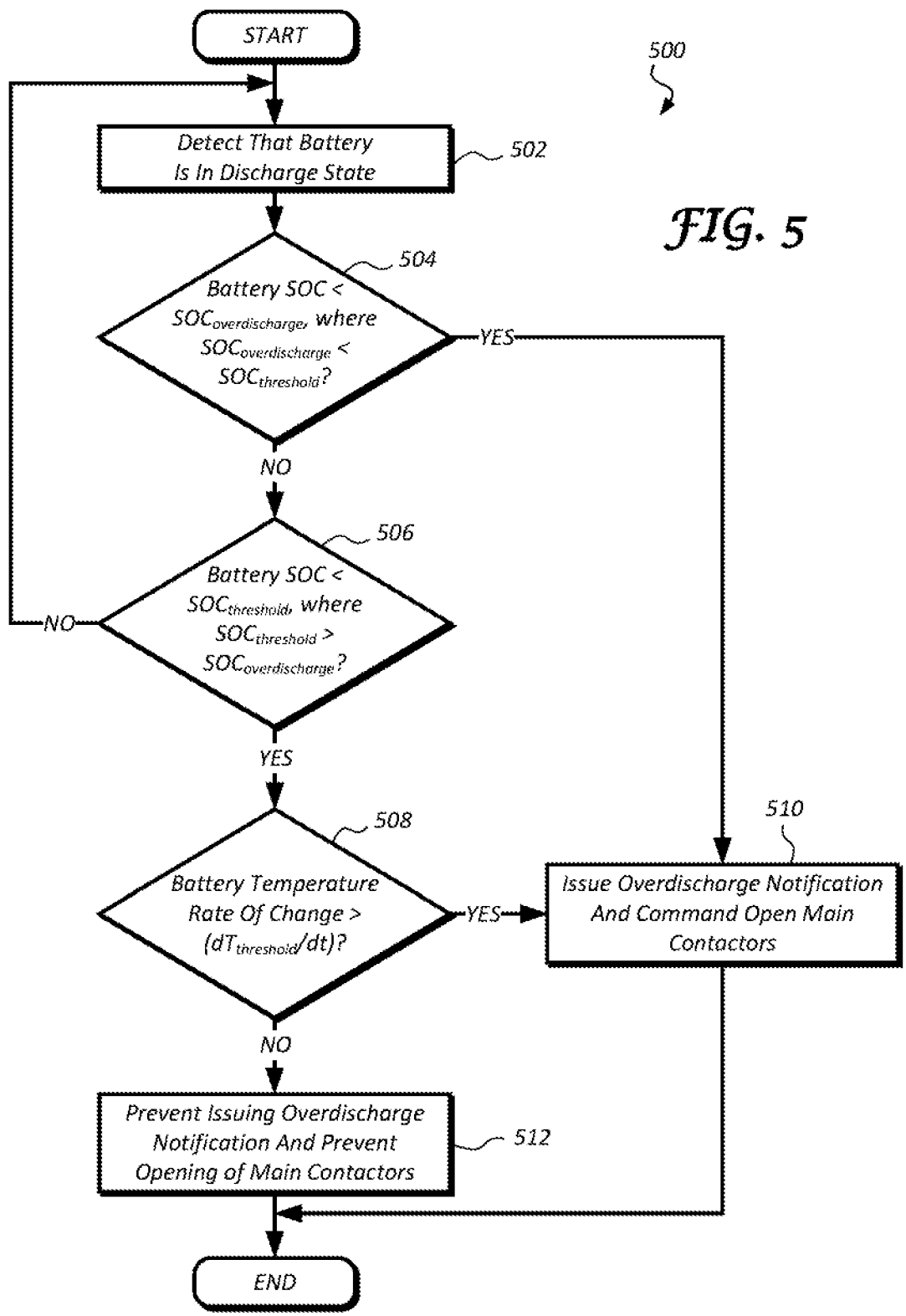

SYSTEM AND METHOD FOR DETECTING AND RESPONDING TO A BATTERY OVER-DISCHARGE CONDITION WITHIN A VEHICLE

TECHNICAL FIELD

The present disclosure relates to systems and methods for detecting a traction battery over discharge condition.

BACKGROUND

Hybrid-electric and other electrified vehicles utilize stored energy for propulsion. A traction battery may include a plurality of electrochemical cells connected to a bussed electrical center (BEC) via positive and negative battery terminals. The battery cells may have any suitable configuration and serve to receive and store electric energy for use in operation of the vehicle. Energy may be received from an electrical grid during a charging event, e.g., at a charging station connected to a power grid. An on-board motor may also generate energy during regenerative braking events. Electrified vehicles rely on various electrical systems to manage and distribute power to the various components. Electrified vehicles often utilize contactors and switches to manage the power flow between high-voltage electrical devices.

SUMMARY

A system includes contactors electrically connecting a traction battery and a vehicle bus when closed, and a controller configured to issue an over discharge alert and open the contactors responsive to a battery temperature rate of change, measured during battery discharge and while a battery state of charge (SOC) exceeds a first threshold, being greater than a predefined rate.

A method includes issuing, by a controller, an over discharge alert and commanding open contactors that electrically connect a traction battery to a vehicle bus when closed responsive to a battery temperature rate of change, measured during battery discharge and while a battery state of charge (SOC) is greater than an alert threshold, being greater than a predefined rate.

A system includes a pair of contactors electrically connecting a traction battery and a vehicle bus when closed, and a controller configured to, responsive to a battery state of charge (SOC) falling within a predefined range and a battery temperature rate of change during discharge exceeding a predefined rate, open the contactors.

BRIEF DESCRIPTION OF THE DRAWINGS

FIG. 5 is a flowchart illustrating an algorithm for detecting a battery over discharge condition.

DETAILED DESCRIPTION

Figure 1:
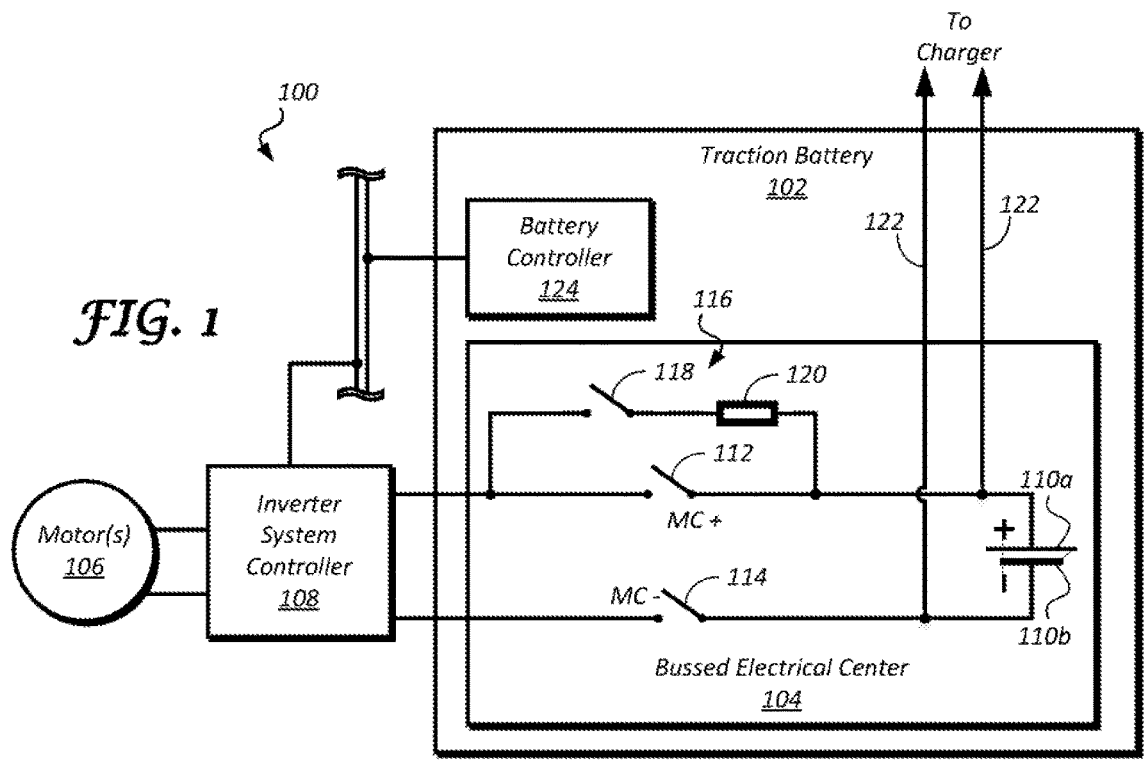
FIG. 1 is a block diagram illustrating propulsion and energy storage components of an electrified vehicle.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A lithium-ion battery will experience an over discharge condition responsive to the SOC of the battery being less a predefined threshold. An over discharge condition may reversibly or irreversibly damage the battery. In some instances, even if the battery may be recharged to a predefined voltage range following an occurrence of an over discharge condition, the capacity and/or efficiency of the battery may deteriorate as compared to batteries of a similar age. Responsive to detecting an over discharge condition, a battery controller may lower a discharge power limit and/or open battery main contactors. Opening the main contactors may cause the traction battery to be disconnected from a high voltage bus thereby powering down the hybrid electrified vehicle. Thus, avoiding an occurrence of a false positive in detecting a battery over discharge condition may be desirable.

When detecting an over discharge condition within a traction battery, a battery controller may reduce battery discharge power limit to 0 kilowatt (kW) and then open contactors to disconnect the traction battery from the load after a predetermined period. In addition to being based on voltage of the traction battery and/or battery state-of-charge (SOC), a battery over discharge detection method may be based on battery temperature. Detecting a battery over discharge condition based on temperature of the traction battery may decrease instances of false positive over discharge indications occurring due to cell voltage measurement error and/or SOC calculation error. Battery SOC can be estimated by ampere*hour integration method. But for long time driving, the accumulated current integration error may cause SOC estimation diverge from its true value.

Voltage measured at the terminals of a traction battery may correspond to the SOC of that battery. For example, for a given current amount, an increase in the battery SOC may correspond to an increase in the terminal voltage of the traction battery. Internal resistance of lithium ion battery at a lower SOC may be greater than the internal resistance of a same battery at a higher SOC. Also, due to entropy in reversible heat, when lithium ion battery is discharged at low SOC, the battery may release extra heat that is greater than heat generated by resistance of the battery. In some instances, a battery management system may be configured to detect battery over discharge based on battery voltage/SOC. In some other instances, lithium ion battery over discharge condition detection may be based on both the battery voltage/SOC and a rate of change of battery temperature.

FIG. 1 illustrates an example electrified vehicle (hereinafter, vehicle) 100 equipped to transfer energy between an electric machine 106 and a traction battery 102. In some instances, the traction battery 102 configured to receive electric charge via a charging session, e.g., at a charging station connected to a power grid. A plurality of electrochemical cells (not illustrated) of the traction battery 102 may be connected to a bussed electrical center (BEC) 104 via positive and negative terminals 110. The battery cells may have any suitable configuration and serve to receive and store electric energy for use in operation of the vehicle 100. As one example, each cell may provide a same or different nominal level of voltage. As another example, the battery cells may be arranged into one or more arrays, sections, or modules further connected in series or in parallel. While the traction battery 102 is described to include, for example, electrochemical battery cells, other types of energy storage device implementations, such as capacitors, are also contemplated.

The vehicle 100 may further comprise one or more electric machines 106 mechanically connected to a hybrid transmission that is in turn mechanically connected to one or more of an engine and a drive shaft propelling wheels. The electric machines 106 may be configured to operate as a motor or a generator. In some instances, the electric machines 106 can provide propulsion and deceleration capability when the engine is turned on or off using energy stored in the traction battery 102. In other examples, the electric machines 106 also act as generators and can provide fuel economy benefits by recovering energy that would normally be lost as heat in the friction braking system. The electric machines 106 may also provide reduced pollutant emissions since the vehicle 100 may be operated in electric mode under certain conditions.

The traction battery 102 typically provides a high-voltage direct current (DC) output. The traction battery 102 may be electrically connected to an inverter system controller (ISC) 108. The ISC 108 is electrically connected to the electric machines 106 and provides the ability to bi-directionally transfer energy between the traction battery 102 and the electric machines 106. In a motor mode, the ISC 108 may convert the DC output provided by the traction battery 102 to a three-phase alternating current (AC) as may be required for proper functionality of the electric machines 106. In a regenerative mode, the ISC 108 may convert the three-phase AC output from the electric machines 106 acting as generators to the DC input required by the traction battery 102. While the vehicle 100 of FIG. 1 is described as a plug-in hybrid electric vehicle, the description herein is equally applicable to a pure electric vehicle. For a pure electric vehicle, e.g., battery electric vehicle (BEV), the hybrid transmission may be a gear box connected to the electric machines 106 and the engine may not be present.

In addition to providing energy for propulsion, the traction battery 102 may provide energy for other vehicle electrical systems. For example, the traction battery 102 may transfer energy to high-voltage loads, such as, but not limited to, an air conditioning (A/C) compressor and electric heater. In another example, the traction battery 102 may provide energy to low-voltage loads, such as, but not limited to, an auxiliary 12-V battery. In such an example, the vehicle 100 may include a DC/DC converter (not illustrated) configured to convert the high-voltage DC output of the traction battery 102 to a low-voltage DC supply that is compatible with the low-voltage loads. The various components discussed may have one or more associated controllers to control and monitor the operation of the components. The controllers may communicate via a serial bus (e.g., Controller Area Network (CAN)) or via discrete conductors.

In one example, closing one or more of the contactors 112, 114, and 118, in some instances, enables power flow to the electric machines 106 and/or the high-voltage loads, such as compressors and electric heaters, via a connection to the conductors that extend between a respective one of the contactor 112, 114, 118 and the ISC 108. In still another example, closing one or more of the contactors 112, 114, and 118 may enable energy transfer to and from the low-voltage loads, such as a 12-V auxiliary battery, via the DC/DC converter connected to electrical conductor lines extending between the ISC 108 and the positive and negative terminals 110a, 110b. In one example, the main contactors 112, 114 in combination with the pre-charge circuit 116 may be used to charge 122 the traction battery 102, such as via a connection to a charging station. In another example, the battery controller 124 may be configured to command the opening and closing of one or more AC and/or DC charging contactors (not illustrated) responsive to receiving a signal indicative of a request to initiate charging of the traction battery 102.

Figure 2:
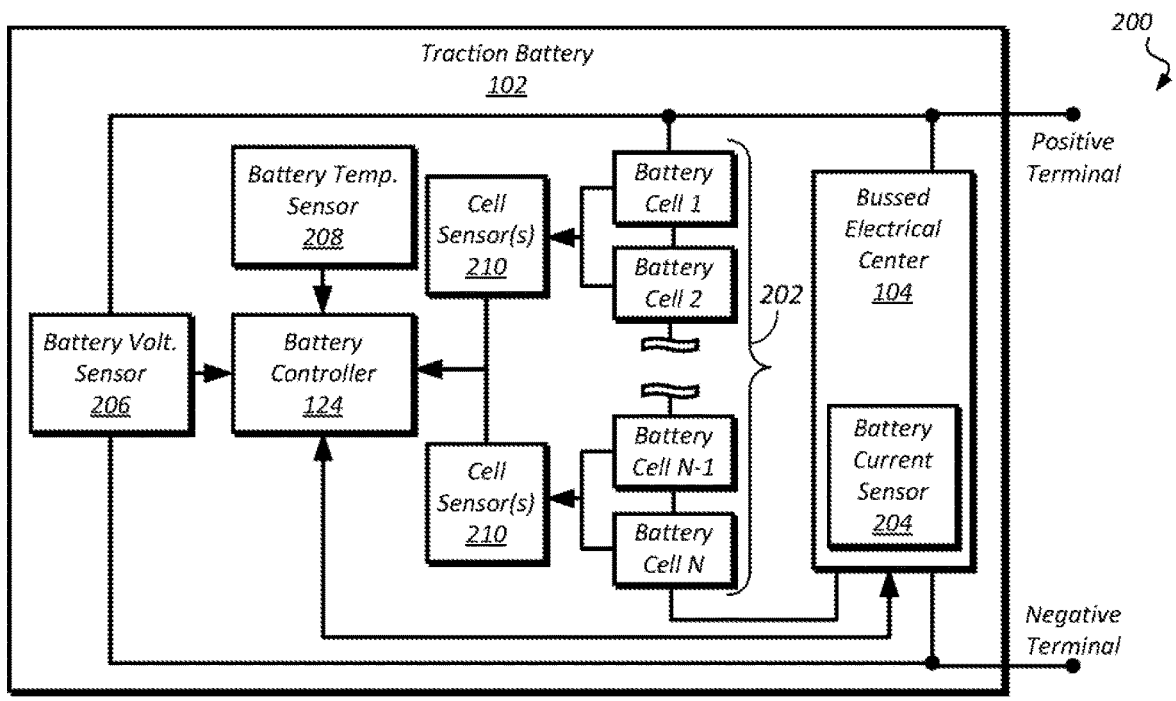
FIG. 2 is a block diagram illustrating components of a traction battery.

FIG. 2 illustrates an example arrangement 200 of the traction battery 102. The traction battery 102 may comprise a plurality of battery cells 202, e.g., electrochemical cells, electrically connected to the BEC 104. The plurality of connectors and switches of the BEC 104 enable the supply and withdrawal of electric energy to and from the battery cells 202. In one example, the BEC 104 includes a positive main contactor electrically connected to a positive terminal of the battery cells 202 and a negative main contactor electrically connected to a negative terminal of the battery cells 202. Closing the positive and negative main contactors may enable the flow of electric energy to and from the battery cells 202. While the traction battery 102 is described herein as including electrochemical cells, other types of energy storage device implementations, such as capacitors, are also contemplated.

A battery controller 124 is electrically connected to the BEC 104 and controls the energy flow to and from the battery cells 202 via the BEC 104. For example, the battery controller 124 may command the BEC 104 to open or close one or more switches responsive to one or more operating parameters of the traction battery 102 and or the battery cells 202 reaching a predetermined threshold. In another example, the battery controller 124 may be electrically connected to and in communication with one or more other vehicle controllers, such as a powertrain controller, a body controller, a climate control management controller and so on, and may command the BEC 104 to open or close one or more switches responsive to a predetermined signal from the other vehicle controllers.

The battery controller 124 may monitor and control the performance of the traction battery 102. The battery controller 124 may monitor several parameters indicative of the traction battery 102 operation, such as traction battery current $I_{BATT}$ measured by a current sensor 204, traction battery voltage $V_{BATT}$ measured by a voltage sensor 206, and traction battery temperature $T_{BATT}$ measured by a temperature sensor 208. In one example, an actual capacity $C_{actual}$ of the traction battery 102 expressed as a percentage of a total battery capacity $C_{total}$, such as battery 102 capacity when the traction battery 102 is fully charged, may be indicative of an estimate battery capacity C and battery state of charge (SOC).

In addition to the traction battery operating parameters, the battery controller 124 may measure and monitor operating parameters of one or more battery cells 202, such as, but not limited to, battery cell terminal voltage and temperature. In one example, the battery controller 124 may be configured to receive a signal from cell sensors 210 indicating operating parameters of the one or more battery cells 202. The operating parameters may include, but are not limited to, battery cell terminal voltage, temperature, age, number of charge/discharge cycles, and so on. The battery controller 124 may include non-volatile memory such that battery level and/or battery cell level data may be retained when the battery controller 124 is turned off. In one example, the retained data may be available upon the next ignition cycle.

Typically, the cell sensors 210 will measure terminal voltage of the battery cells 202. The cell sensors 210 may be configured to transmit a signal to the battery controller 124 indicating the measured terminal voltage of the battery cells 202. In one example, the cell sensors 50 may not be configured to measure current of the battery cells 202 directly, however, configuration and/or arrangement of the one or more battery cells 202 of the traction battery 102, e.g., series arrangement, may define current through the one or more battery cells 202 as the traction battery current measured by the current sensor 204.

The current sensor 204 may be configured to measure charge and/or discharge current of the traction battery 102. The current sensor 204 may be configured to measure current directly, i.e., measure a voltage drop associated with current passing through a passive electrical component, such as a resistor, or indirectly, i.e., measure a magnetic field surrounding a conductor through which the current is passing. In one example, the current sensor 204 may be a closed-loop current sensor that uses feedback control to provide output proportional to a measured current. In another example, the current sensor 204 may be an open-loop current sensor, such as a Hall sensor mounted in an air gap of a magnetic core, providing output without relying on feedback control.

The voltage sensor 206 may be configured to measure battery 102 voltage and send a signal to the battery controller 124 indicative of the detected battery 102 voltage. The current sensor 204 may be configured to measure battery 102 current and send a signal to the battery controller 124 indicative of the detected battery 102 current. In one example, negative battery current $I_{BATT\_N}$ may be indicative of charge current $I_{CHRG}$ of the traction battery 102. As another example, positive battery current $I_{BATT\_P}$ may be indicative of discharge current $I_{DISCH}$ of the traction battery 102.

Figure 3A:
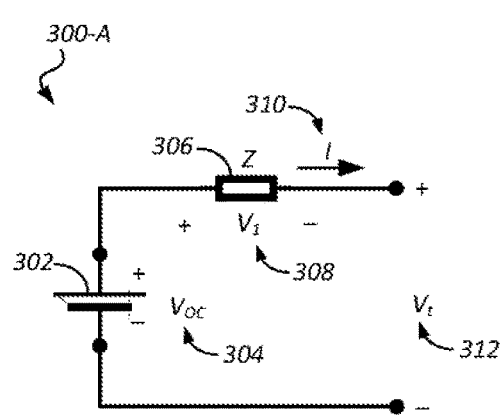
FIG. 3A is a schematic diagram illustrating an open-circuit model of a lithium-ion battery cell.

FIG. 3A illustrates an example circuit model 300-A of at least one of the battery cells 202. In one example, the circuit model 300-A may include an ideal voltage source 302 having voltage $V_{OC}$ 304 and having associated impedance Z. The impedance Z may comprise one or more resistances (indicated generally as a resistor 306). The voltage $V_{OC}$ 304 may represent, for example, an open-circuit voltage $V_{OC}$ of at least one of the battery cells 202, such as voltage of the battery cell 202 under equilibrium conditions, i.e., when no current is flowing in or out of the battery 102 and/or the battery cells 202. While the circuit model 300-A in reference to FIG. 3A is directed to one battery cell 202, application of the model to any combination of the battery cells 202 is also contemplated. Values of the parameters associated with the circuit model 300-A may, thus, be representative of the values of two battery cells 202, three battery cells 202, and so on. For example, in various configurations of the model the open-circuit voltage $V_{OC}$ 54 may thus represent open-circuit voltage of one, two, or any other number of the plurality of battery cells 202.

The resistor 306 may represent an internal resistance R of the battery cell 202 and/or the traction battery 102 including resistance of a battery harness and other components associated with the traction battery 102. In some instances, the circuit model 300-A may be indicative of open-circuit operation of a plurality of the battery cells 202 and the resistor 306 may be indicative a sum of internal resistances R of those battery cells 202. The voltage $V_1$ 308 may be indicative of a voltage drop across the resistor 306 caused by current I 310 flowing through the resistor 306. Terminal voltage $V_t$ 312 may be indicative of voltage across the positive and negative terminals 110 of the battery cell 202. The terminal voltage $V_t$ 312 may be different from the open-circuit voltage $V_{OC}$ 54 as a result of the internal resistance R associated with the battery cell 38 and/or the one or more components of the traction battery 102.

Values of the internal resistance R and other parameters of the traction battery 102 and/or the battery cells 202 may depend on the battery chemistry. The parameters may further vary based on the operating conditions of the traction battery 102. The values of the parameters may also vary as a function of the battery temperature. For example, the internal resistance R may decrease as temperature increases and so on. The parameter values may also depend on the SOC of the traction battery 102.

Values of the parameters of the traction battery 102 may also change over a life of the traction battery 102. In one example, the internal resistance R may increase over the life of the traction battery 102. The increase in internal resistance R may further vary as a function of temperature and/or SOC during the life of traction battery 102. For example, operating the traction battery 102 at higher temperatures and/or higher SOC may cause a larger increase in internal resistance R of the traction battery 102 over a predetermined period, such that the internal resistance R of the traction battery 102, operating at 80° C. over a predetermined period, may increase more than the internal resistance R of the traction battery 102 operating at 50° C. over a similar period and/or the internal resistance R of the traction battery 102 operating at 90% SOC may increase more than the internal resistance R of the traction battery 102 operating at a same temperature and 50% SOC. These relationships may further depend on the battery 102 chemistry.

The battery controller 124 may be configured to determine the internal resistance R and other operating parameters associated with the traction battery 102 based on one or more measured and/or estimated properties of the traction battery 102. In one example, the battery controller 124 may be configured to determine internal resistance R of the traction battery 102 based on measured and estimated properties, such as, but not limited to, battery SOC, battery temperature, battery age, and so on. In another example, the battery controller 124 may be configured to determine internal resistance of a portion of the traction battery 102, e.g., one or more battery cells 202, modules, and so on, based on one or more measured and/or estimated properties associated with the portion.

The circuit model 300-A may be expressed using Equation (1):

$$V_t = V_{OC} - IR \qquad (1)$$

The battery controller 124 may be configured to receive a signal indicating the terminal voltage $V_t$ 312 of the battery cell 202, such as via a signal generated by the cell sensor 210. The open-circuit voltage $V_{OC}$ 304 may be a function of battery cell SOC, i.e., $V_{OC}$=f(SOC), such that the open-circuit voltage $V_{OC}$ 304 may vary as a function of charging and discharging of the battery cell 202. While the circuit model 300-A described in reference to FIG. 3A illustrates a single battery cell 202, the model 300-A may also be applied to a plurality of battery cells 202 and/or all cells 202 of the battery 102. In some instances, the battery open-circuit voltage $V_{OC}$ may be a function of battery SOC, i.e., $V_{OC\_BATT} = f(SOC_{BATT})$, such that the battery open-circuit voltage $V_{OC\_BATT}$ may vary as a function of charging and discharging of the traction battery 102.

Figure 3B:
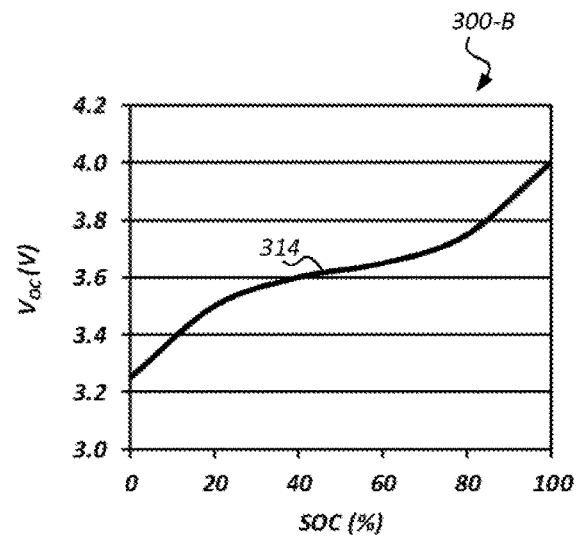
FIG. 3B is a graph illustrating a change in battery cell voltage with respect to a cell state of charge (SOC)

FIG. 3B illustrates an example graph 300-B of an example relative relationship between the open-circuit voltage $V_{OC}$ 304 and the SOC of at least one of the battery cells 202 (or the cell $V_{OC}$-SOC curve 314). The relationship between the SOC and the open-circuit voltage $V_{OC}$ 304 may be based on one or more properties of the battery cell 202. The exact shape of the cell $V_{OC}$-SOC curve 314 may vary based on chemical formulation and other variables associated with the at least one of the battery cells 202. A battery $V_{OC}$-SOC curve may be derived using a relationship between battery open-circuit voltage $V_{OC}$ and battery $SOC_{BATT}$. In some instances, the exact shape of the battery $V_{OC}$-SOC curve may vary based on one or more variables associated with the traction battery 102.

In one example, the $V_{OC}$-SOC curves of the battery cells 202 may be determined using testing. The battery controller 124 may be configured to retain data associated with the internal resistance R, the SOC, and/or the open-circuit voltage $V_{OC}$ 304 of the battery cells 202 in the non-volatile memory. In one example, responsive to estimating battery cell SOC, the battery controller 124 may determine the open-circuit voltage $V_{OC}$ 304 using the $V_{OC}$-SOC curve, e.g., the curve 314.

The battery controller 124 may be configured to estimate battery SOC $SOC_{est}$. In one example, the battery controller 124 may estimate battery SOC based on the open circuit voltage $V_{OC}$. For example, $$SOC = f(V_{OC}) = f(V_t + I \cdot R). \quad (2)$$

From Equation (2), the open circuit voltage $V_{OC}$ of the cell 202 and/or battery 102 may be based on measured values of terminal voltage $V_t$, measured or estimated internal resistance R, and measured current I. The estimated battery 102 SOC may then be determined using the $V_{OC}$-SOC graph, e.g., the graph 300-B. Thus, the Equation (2) may be a load-compensated SOC calculation method.

When battery SOC is less than a predefined SOC threshold, resistance of the cells may be greater than a predefined resistance threshold, thereby, generating additional amount of heat. Additionally or alternatively, when the battery 102 is being discharged at SOC that is less than a predefined SOC threshold, e.g., discharged at SOC<10%, the battery 102 components may generate an amount of heat in addition to the resistance-generated heat due to extropy reversible heating phenomenon.

Figure 4:
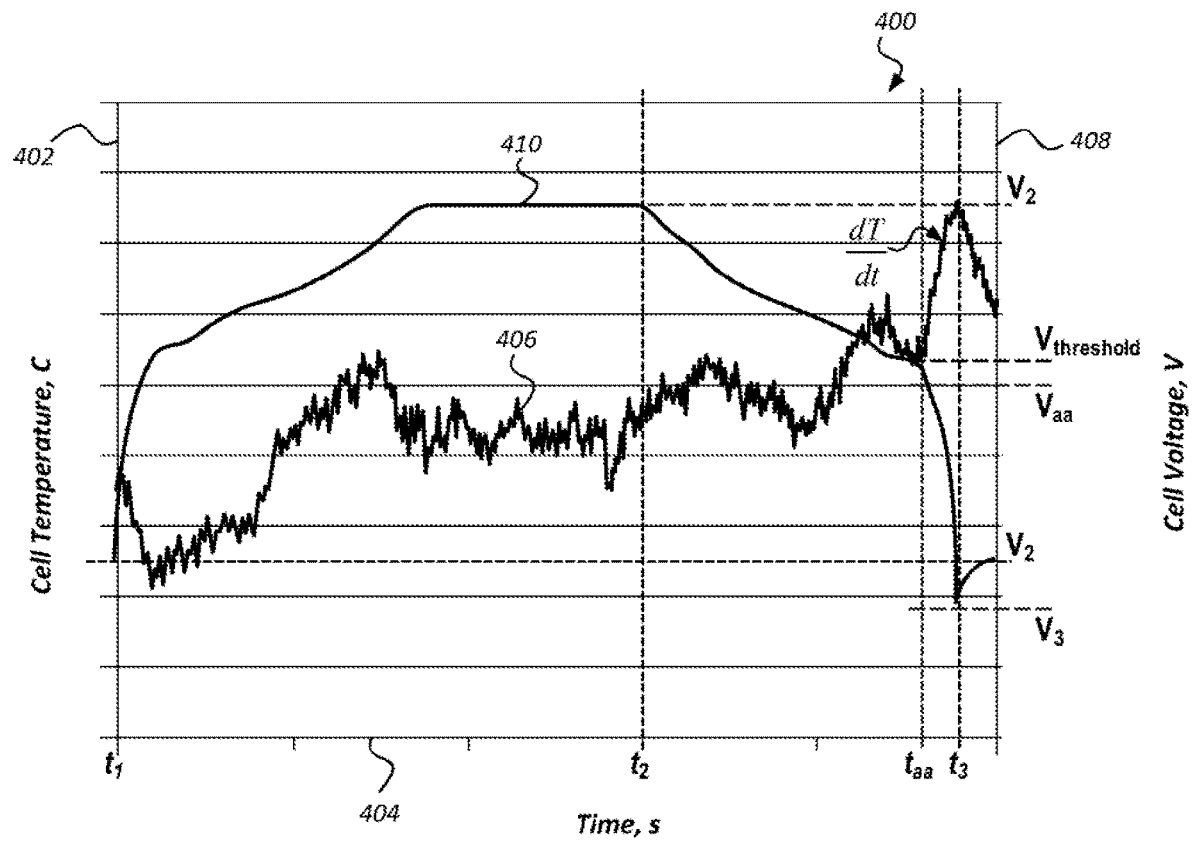
FIG. 4 is a graph illustrating a change in cell voltage and temperature with respect to time.

FIG. 4 illustrates an example graph 400 of a change in temperature 402 of a given cell 202 with respect to a change in voltage 408 of that cell over a same period of time 404. A temperature curve 406 of the graph 400 indicates a change in the cell temperature 402 with respect to time 404. A voltage curve 410 of the graph 400 indicates a change in the cell voltage 408 with respect to time 404. The time period illustrated by the time axis 404 may progress chronologically left to right, such that a portion of the axis 404 to the left of a given time t is indicative of a chronologically preceding time and a portion of the axis 404 to the right of that time t is indicative of a chronologically subsequent time.

As one example, between a first time $t_1$ and a second time $t_2$, the voltage curve 410 may have a non-negative slope, e.g., a positive slope or a zero slope, thereby, indicating that cell 202 voltage value is either increasing or staying the same. As another example, between the second time $t_2$ and a third time $t_3$, the voltage curve 410 may have a negative slope, thereby, indicating that cell 202 voltage value is decreasing. In some instances, the period of time between first and second times $t_1$ and $t_2$ may be referred to as a charge period and the period of time between second and third times $t_2$ and $t_3$ may be referred to as a discharge period.

In one example, during charge of the cell 202, e.g., between the first time $t_1$ and the second time $t_2$, the cell voltage may change from voltage $V_1$ at $t_1$ to voltage $V_2$ at $t_2$, where $V_2 > V_1$. In another example, during discharge of the cell 202, e.g., between the second time $t_2$ and the third time $t_3$, the cell voltage may change from voltage $V_2$ at $t_2$ to voltage $V_3$ at $t_3$, where $V_3 < V_2$.

The battery controller 124 may be configured to detect that cell 202 voltage during discharge, e.g., at one or more instances during the period of time between second and third times $t_2$ and $t_3$, is less than a predefined voltage threshold $V_{threshold}$. As illustrated, for example, in FIG. 4, cell 202 voltage $V_{aa}$ at a time $t_{aa}$ is less than the voltage threshold $V_{threshold}$, i.e., $V_{aa} < V_{threshold}$. Additionally or alternatively, the battery controller 124 may be configured to detect that cell 202 SOC during discharge is less than a predefined SOC threshold $SOC_{threshold}$. The battery controller 124 may, for example, determine the cell/battery SOC based on the current cell/battery voltage using a corresponding $V_{OC}$-SOC graph of an open circuit model and so on.

In still other examples, prior to comparing current battery/cell voltage and/or current battery/cell SOC to a respective one of the voltage threshold $V_{threshold}$ and SOC threshold $SOC_{threshold}$, the battery controller 124 may be configured to detect whether cell 202 voltage and/or SOC during discharge is less than or equal to an over discharge voltage threshold $V_{overdischarge}$ and an over discharge SOC threshold $SOC_{overdischarge}$, where the over discharge voltage threshold $V_{overdischarge}$ is less than the voltage threshold $V_{threshold}$, i.e., $V_{overdischarge} < V_{threshold}$ and/or the overdischarge SOC threshold $SOC_{overdischarge}$ is less than the SOC threshold $SOC_{threshold}$, i.e., $SOC_{overdischarge} < SOC_{threshold}$.

Responsive to the cell 202 voltage being less than the voltage threshold $V_{threshold}$ and/or the cell/battery SOC being less than the SOC threshold $SOC_{threshold}$, the battery controller 124 may be configured to determine a change in temperature T with respect to time t or $$\frac{dT}{dt}.$$

In some instances, the battery controller 124 may be configured to detect whether a change in temperature T with respect to time t, i.e., a derivate of temperature T, is greater than a predefined temperature rate of the change threshold, e.g., greater than $$\frac{dT_{threshold}}{dt}.$$

The battery controller 124 may be further configured to issue an alert indicative of an over discharge condition responsive to detecting that the change in temperature with respect to time, measured responsive to cell/battery voltage (and/or SOC) being less than the voltage threshold $V_{threshold}$, is greater than a temperature rate of change threshold $$\frac{dT_{threshold}}{dt}.$$

Additionally or alternatively, prior to detecting whether temperature rate of the change $$\frac{dT}{dt}$$

is greater than the temperature rate of change threshold $$\frac{dT_{threshold}}{dt},$$

the battery controller 124 may issue an alert indicative of an over discharge condition responsive to detecting that the cell 202 voltage and/or SOC during discharge is less than or equal to an over discharge voltage threshold $V_{overdischarge}$ and an over discharge SOC threshold $SOC_{overdischarge}$, where $V_{overdischarge} < V_{threshold}$ and $SOC_{overdischarge} < SOC_{threshold}$, respectively.

In some instances, a phenomenon of a reversible entropic heat S may affect the overall heat generation of the cell 202 when the cell 202 SOC is less than a predefined SOC threshold, e.g., the cell 202 SOC less than or equal to 10%. In some other instances, at a predefined current I, the amount of entropic heat ($\Delta S*T*I$) may be greater than the amount of heat generated due to internal resistance of the cell/battery ($I^2R$).

The Savitzky-Golay filter may be an example digital filter applied to determine the derivative of battery 102 temperature with respect to time using Equation (3):

$$dT(k)/dt=[4*T(k+4)+3*T(k+3)+2*T(k+2)+T(k+1)+T(k)-T(k-1)-2*T(k-2)-3*T(k-3)-4*T(k-4)]/(60*h), \quad (3)$$

where h is a parameter indicative of a sampling period, k is a variable indicative of a time index for the sampling point, T is a parameter indicative of a measured battery temperature, and $$\frac{dT}{dt}$$

is a parameter indicative of a rate of change, i.e., a derivative, of temperature of the battery 102 with respect to time. While the Savitzky-Golay filter is described as an example digital filter, other digital or analog filters are also contemplated.

FIG. 5 illustrates an example process 500 for detecting an over discharge condition for the battery 102. The process 500 may begin at operation 502 where the battery controller 124 detects that the battery 102 is in a discharge state. In one example, the battery 102 may be in a discharge operating state when the battery 102 voltage and/or SOC is decreasing. At operation 504, the battery controller 124 detects whether the battery 102 SOC is less than an over discharge SOC threshold $SOC_{overdischarge}$. The battery controller 124 may determine current battery SOC using a correlation between battery 102 open circuit voltage $V_{OC}$ and battery 102 SOC, where the battery open circuit voltage $V_{OC}$ may, in turn, be determined based on one or more of battery current I, battery terminal voltage $V_t$, and actual or estimated internal resistance R of the battery 102 as detected by one or more corresponding battery sensors and/or estimated using one or more algorithms, e.g., Kalman filter.

At operation 510, the battery controller 124 issues an alert indicative of a battery over discharge condition responsive to detecting that the battery 102 SOC is less than an over discharge SOC threshold $SOC_{overdischarge}$. If the battery 102 SOC is greater than the over discharge SOC threshold $SOC_{overdischarge}$, the battery controller 124 may proceed to operation 506.

The battery controller 124, at operation 506, detects whether the battery 102 SOC is less than a predefined SOC threshold $SOC_{threshold}$. In some other instances, the SOC threshold $SOC_{threshold}$ may greater than the over discharge SOC threshold $SOC_{overdischarge}$. Responsive to the battery 102 SOC being greater than a predefined SOC threshold $SOC_{threshold}$, the battery controller 124 returns to operation 502 where the battery controller 124 detects that the battery 102 is in a discharge operating state.

Responsive to the battery 102 SOC being less than a predefined SOC threshold $SOC_{threshold}$, the battery controller 124, at operation 508, detects whether the battery 102 temperature rate of change $$\frac{dT}{dt}$$

is greater than a predefined temperature rate of change threshold $$\frac{dT_{threshold}}{dt}.$$

At operation 512, the battery controller 124 prevents issuing an alert indicative of a battery over discharge condition responsive to the battery 102 temperature rate of change $$\frac{dT}{dt}$$

being less than a predefined temperature rate of change threshold $$\frac{dT_{threshold}}{dt}.$$

The battery controller 124 may further prevent opening of the main contactors 112, 114 if the battery 102 temperature rate of change $$\frac{dT}{dt}$$

is less than a predefined temperature rate of change threshold $$\frac{dT_{threshold}}{dt}.$$

Responsive to the battery 102 temperature rate of change $$\frac{dT}{dt}$$

being greater than a predefined temperature rate of change threshold $$\frac{dT_{threshold}}{dt},$$

the battery controller 124 issues a notification indicative of a battery over discharge condition. In some instances, the temperature rate of change threshold $$\frac{dT_{threshold}}{dt}$$

may be based on an amount of reversible entropic heat being generated as compared to an amount of heat generated due to battery 102 internal resistance.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A system comprising:
   contactors electrically connecting a traction battery and a vehicle bus when closed; and
   a controller configured to issue an over discharge alert and open the contactors responsive to a battery temperature rate of change, measured during battery discharge and while a battery state of charge (SOC) exceeds a first threshold, being greater than a predefined rate.

2. The system of claim 1, wherein the issuing and opening is further responsive to the SOC being less than a second threshold greater than the first.

3. The system of claim 1, wherein the SOC is based on one of battery terminal voltage, battery current, and battery internal resistance.

4. The system of claim 3, wherein the SOC is further based on a battery open circuit voltage.

5. The system of claim 1, wherein the battery discharge is defined by a decrease of one of the SOC and battery voltage.

6. The system of claim 1, wherein opening the contactors both interrupts the battery discharge and severs the electrical connection between the battery and the bus.

7. A method comprising:
   issuing an over discharge alert and opening a pair of contactors that operate to electrically connect a traction battery to a vehicle bus in response to a battery temperature rate of change being greater than a predefined rate, wherein the battery temperature rate of change is measured during battery discharge and while a battery state of charge (SOC) is greater than an alert threshold.

8. The method of claim 7 further comprising issuing and opening responsive to the SOC being less than a second threshold greater than the first.

9. The method of claim 7, wherein the SOC is based on one of battery terminal voltage, battery current, and battery internal resistance.

10. The method of claim 9, wherein the SOC is further based on a battery open circuit voltage.

11. The method of claim 7, wherein the battery discharge is defined by one of the SOC and battery voltage decreasing.

12. The method of claim 7, wherein opening the pair of contactors includes both interrupting the battery discharge and severing the electrical connection between the battery and the bus.

13. A system comprising:
    a pair of contactors electrically connecting a traction battery and a vehicle bus when closed; and
    a controller configured to, responsive to a battery state of charge (SOC) falling within a predefined range and a battery temperature rate of change during discharge exceeding a predefined rate, open the contactors.

14. The system of claim 13, wherein the SOC is based on one of battery terminal voltage, battery current, and battery internal resistance.

15. The system of claim 14, wherein the SOC is further based on a battery open circuit voltage.

16. The system of claim 13, wherein the discharge is defined by a decrease of one of the SOC and battery voltage.

17. The system of claim 13, wherein opening the contactors both interrupts the discharge and severs the electrical connection between the battery and the bus.

* * * * *